United States Patent
He et al.

(10) Patent No.: US 6,878,589 B1
(45) Date of Patent: Apr. 12, 2005

(54) METHOD AND SYSTEM FOR IMPROVING SHORT CHANNEL EFFECT ON A FLOATING GATE DEVICE

(75) Inventors: Yue-Song He, San Jose, CA (US); Richard Fastow, Cupertino, CA (US); Xin Guo, Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/431,322

(22) Filed: May 6, 2003

(51) Int. Cl.[7] ............. H01L 29/76; H01L 29/94; H01L 31/062; H01L 31/113; H01L 31/119

(52) U.S. Cl. ............ 438/257; 438/258; 438/260; 438/261; 438/267; 257/314; 257/315; 257/316; 257/317; 257/318

(58) Field of Search .................. 257/314–323; 438/257, 258, 260, 261, 267, 525

(56) References Cited

U.S. PATENT DOCUMENTS

| | | | | |
|---|---|---|---|---|
| 5,147,811 A | * | 9/1992 | Sakagami | 438/257 |
| 5,780,912 A | * | 7/1998 | Burr et al. | 257/408 |
| 5,920,776 A | * | 7/1999 | Fratin et al. | 438/257 |
| 6,284,603 B1 | * | 9/2001 | Ho Simon et al. | 438/264 |
| 6,380,041 B1 | * | 4/2002 | Yeap et al. | 438/302 |
| 6,518,122 B1 | * | 2/2003 | Chan et al. | 439/257 |
| 6,541,821 B1 | * | 4/2003 | Krishnan et al. | 257/347 |
| 6,630,385 B1 | * | 10/2003 | Yu | 438/289 |
| 6,706,582 B2 | * | 3/2004 | Yanagida et al. | 438/231 |
| 6,713,812 B1 | * | 3/2004 | Hoefler et al. | 257/316 |
| 2001/0012672 A1 | * | 8/2001 | Dennison et al. | 438/306 |
| 2003/0134474 A1 | * | 7/2003 | Chan et al. | 438/257 |

* cited by examiner

*Primary Examiner*—Tom Thomas
*Assistant Examiner*—Jesse A. Fenty

(57) ABSTRACT

A method and system for improving short channel effect on a floating gate device is disclosed. In one embodiment, a p-type implant is applied to a source side of the floating gate device. In addition, the present embodiment applies a p-type implant to a drain side of the floating gate device. The p-type implant to the drain side is performed at a different angle than the p-type implant to the source side. The p-type implant to the drain side is implanted to a greater depth than that of the p-type implant to the source side.

14 Claims, 6 Drawing Sheets

METHOD AND SYSTEM FOR IMPROVING SHORT CHANNEL EFFECT ON A FLOATING GATE DEVICE

FIELD OF THE INVENTION

The present invention relates to the field of floating gate devices. Specifically, the present invention relates to improving short channel effect on a floating gate device using both a source side boron implant and a drain side boron implant.

BACKGROUND ART

A modern integrated circuit (IC), for example a flash memory device, may have millions to hundreds of millions of devices made up of complex, multi-layered structures that are fabricated through hundreds of processing steps. Those structures, for example a gate stack, are formed by repeated deposition and patterning of thin films on a silicon substrate, also known as a wafer.

As channel length grows shorter, threshold voltage, the voltage required to turn on a transistor, begins to decrease and leakage current increases. These effects are commonly referred to in the semiconductor arts as the "short channel effects" (SCE). An increase in leakage current is particularly onerous in flash memory devices as flash has found wide acceptance in very low power applications, for example mobile phones, due to the ability of flash to retain information without applied power. Increases in leakage current may have a significant deleterious effect on total power consumption of the flash device and the product using the flash device.

The distance between source and drain regions is often referred to as the physical channel length. However, after implantation and subsequent diffusion of the source and drains, distance between the source and drains regions becomes less than the physical channel length and is often referred to as the effective channel length (Leff). In VLSI designs, as the physical channel becomes small, so must the Leff. SCE becomes a predominant problem whenever Leff drops.

Generally speaking, SCE impacts device operation by, inter alia, reducing device threshold voltages and increasing sub-threshold currents. As Leff becomes quite small, the depletion regions associated with the source and drain areas may extend toward one another and substantially occupy the channel area. Hence, some of the channel will be partially depleted without any influence of gate voltage. As a result, less gale charge is required to invert the channel of a transistor having a short Leff. Somewhat related to threshold voltage lowering is the concept of subthreshold current flow. Even at times when the gate voltage is below the threshold amount, current between the source and drain nonetheless exist for transistors having a relatively short Leff.

Two primary causes of increased sub-threshold current are punch through and drain-induced barrier lowering (DIBL). Punch through results from widening of the drain depletion region when a reverse-bias voltage is applied across the drain-well diode. The electric field of the drain may eventually penetrate to the source area, thereby reducing the potential energy barrier of the source-to-body junction. Punch through current is therefore associated within the substrate bulk material, well below the substrate surface. Contrary to punch through current, DIBL induced current occurs mostly at the substrate surface. Application of a drain voltage can cause the surface potential to be lowered, resulting in a lowered potential energy barrier at the surface, and causing the sub-threshold current in the channel near the silicon—silicon dioxide interface to be increased.

One solution to decrease DIBL has been source side boron implants (SSBI). By using an SSBI, a graded concentration of boron can be driven into the channel region to help reduce DIBL and therefore control short channel effect. However, as the size of the device is reduced, SSBI no longer work as efficiently. For example, short channel effect occurs when the SSBI diffuses into the channel uniformly.

Thus, a need exists for a method and system for improving short channel effect on a floating gate device. A further need exists for a method and system for improving short channel effect on a floating gate device that works with reduced memory device sizes. Yet another need exists for a method and system for improving short channel effect on a floating gate device which meets the above needs and which is compatible with existing memory manufacturing processes.

SUMMARY OF INVENTION

A method and system for improving short channel effect on a floating gate device is disclosed. In one embodiment, a p-type implant is applied to a source side of the floating gate device. In addition, the present embodiment applies a p-type implant to a drain side of the floating gate device. The p-type implant to the drain side is performed at a different angle than the p-type implant to the source side. The p-type implant to the drain side is implanted to a greater depth than that of the p-type implant to the source side.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

The present invention provides a method and structure for improving short channel effect on a floating gate device. In one embodiment, the floating gate device is a flash memory cell having a source and a drain. To provide the flash memory cell, a source implant is provided. In one embodiment, the source implant may be source side boron implant (SSBI). In addition, an implant is performed on the drain side at a higher energy level than the SSBI. In one embodiment, the drain side implant may be a drain side boron implant (DSBI). By implanting the drain side boron implant (DSBI) at a higher energy level and at a different angle than the SSBI, (e.g., the DSBI implant may be deeper in the substrate than the SSBI) a dopant profile which does not easily diffuse is provided. Although boron is specifically stated herein, it is appreciated that any p-type material similar to boron may be utilized as the drain and/or source side implant. Typically, the present invention is incorporated into the manufacture of a semiconductor device after a gate stack is formed and before a spacer is formed.

Figure 1:
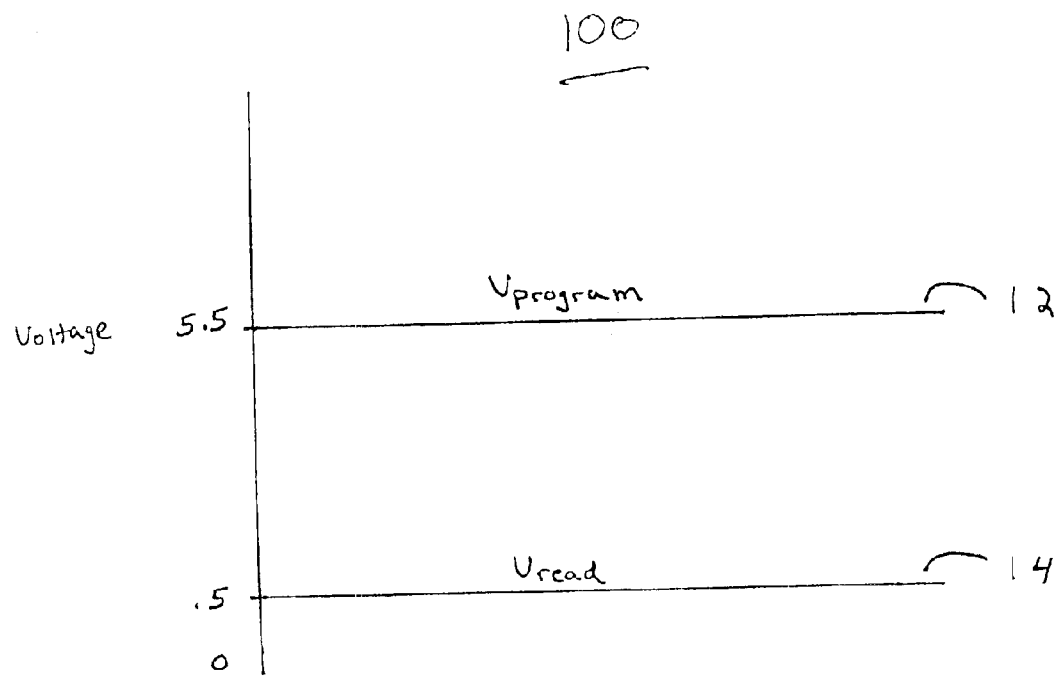
FIG. 1 is a graph illustrating the voltages applied to an exemplary semiconductor device during read and program modes in accordance with an embodiment of the present invention.

FIG. 1 is a graph 100 illustrating the difference in voltage applied to a flash memory cell during read and program activity. Typically the voltage applied to the drain during reading 14 is approximately 0.5 volts and the voltage applied to the drain during programming 12 is approximately 5.5 volts. As stated above, DIBL is the lowering of a threshold barrier voltage for the conduction of current across a transistor. DIBL becomes a concern typically when higher voltages are used during programming. When reading or programming a flash memory, current is applied to all devices along a bit line (even to transistors that are not given a drain bias). If DIBL causes the threshold voltage to drop enough, current leaks across memory cells that are not selected (no drain bias) causing deleterious effects during programming.

For purposes of clarity, process 300 of FIG. 2 will be described in conjunction with the structure 400 of FIGS. 3A–3E which illustrate structure 400 as it undergoes process 300 in accordance with an embodiment of the present invention.

Figure 2:
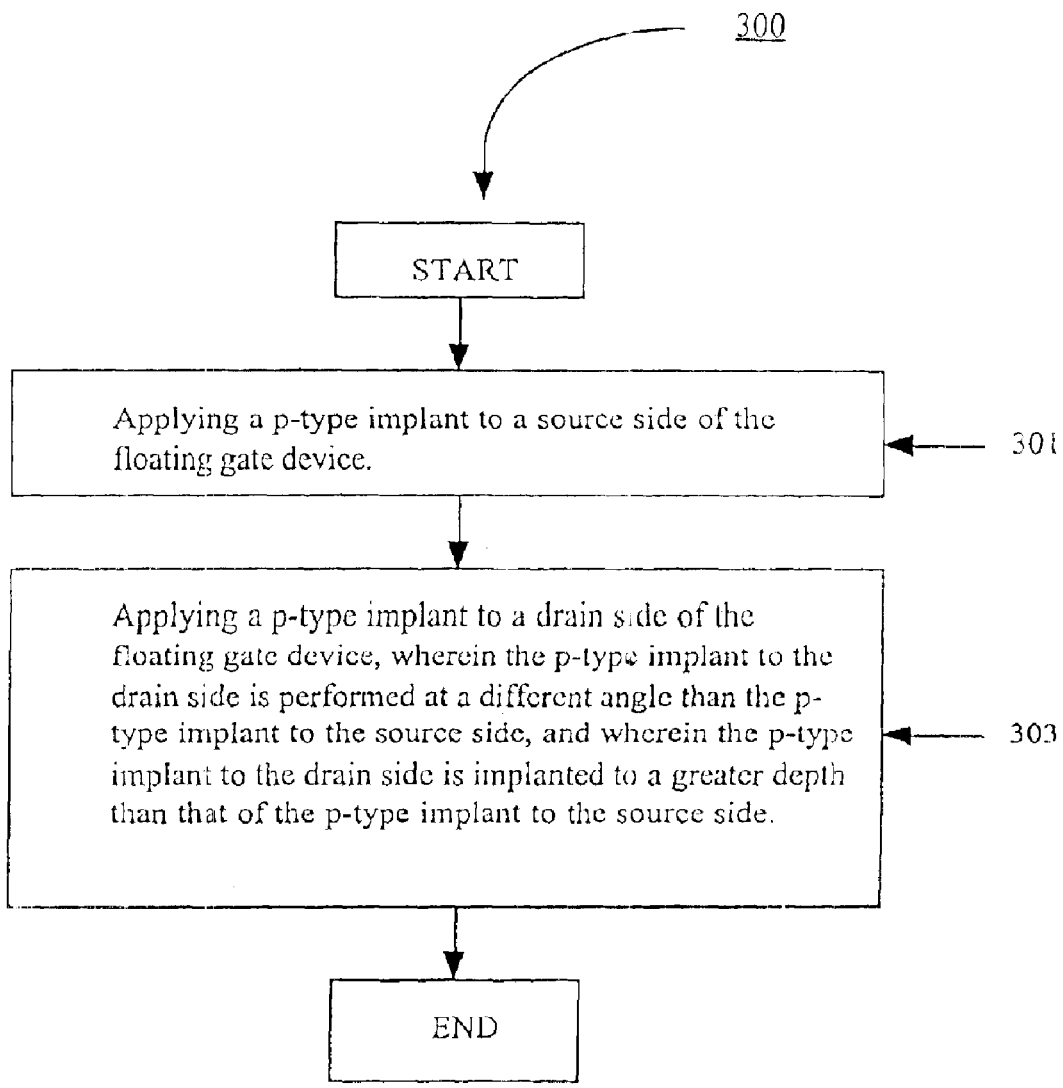
FIG. 2 is a flowchart of steps performed in accordance with one embodiment of the present invention for improving short channel effect on a floating gate device.

With reference now to FIG. 2, a flowchart of steps performed in accordance with one embodiment of the present invention for improving short channel effect on a floating gate device. Specifically, FIG. 2 is a flow diagram of an exemplary process 300 wherein a source side dopant is implanted on the source side of a semiconductor device, and a drain side dopant is implanted on the drain side of a semiconductor device to reduce DIBL. Typically, the source side dopant and the drain side dopant are implanted after a gate stack is formed. Detailed processing steps of forming and cutting a gate stack are eliminated from process 300 for clarity. In addition, intermediate processing steps such as rapid thermal anneals (RTAs) and vapor phase corrosion inhibitors (VCIs) are not included in process 300 for clarity. While many processing steps may be provided in-between the processing steps of the present invention, the additional steps have very little bearing on the details of process 300 of the present invention.

Figure 3A:
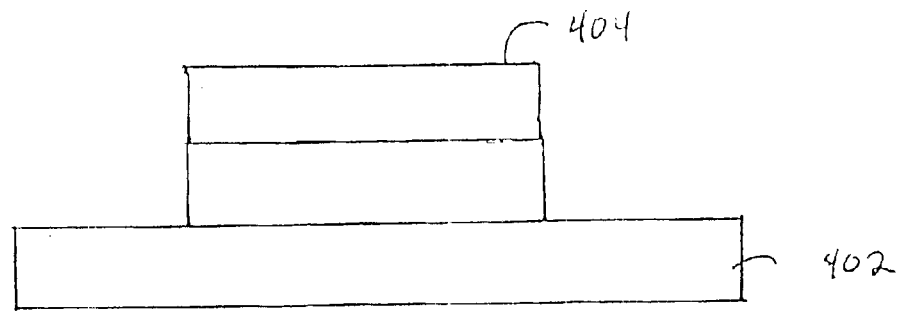
FIG. 3A is an illustration of an exemplary semiconductor device illustrating a gate stack in accordance with an embodiment of the present invention.

Prior to step 301 of process 300 of FIG. 2, steps of floating gate manufacture are shown in FIG. 3A to provide a starting point for the present invention. For example, a gate stack 404 above substrate 402 is illustrated in FIG. 3A.

Figure 3B:
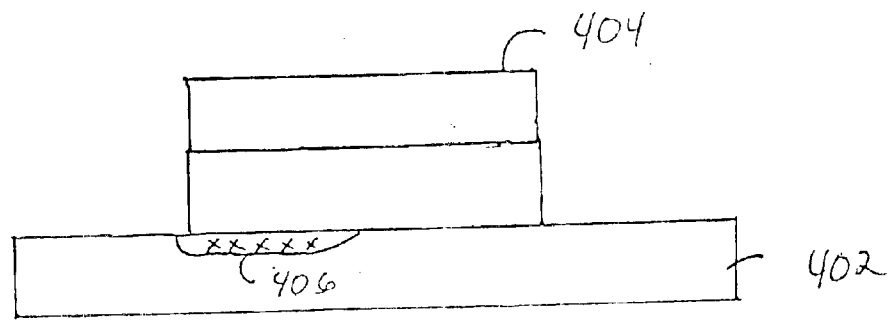
FIG. 3B is an illustration of an exemplary semiconductor device illustrating a source side boron implant in accordance with an embodiment of the present invention.

With reference now to step 301 of FIG. 2 and FIG. 3B, after the gate stack is formed a source side boron implant (SSBI) 406 of FIG. 3B is provided using processing steps familiar to one skilled in the art. In one embodiment, the SSBI is vertically implanted at an energy of 20 kev, and the dosage of the SSBI is approximately $1.5 \times 10^{14}$ p/cm$^2$ (particles per square centimeter). For example, $1.5 \times 10^{14} \pm xyz$ particles, wherein xyz particles may be a small number of higher or lower particles of p/cm$^2$ which may occur during the implant process. The length of the SSBI 408 of FIG. 3B is exaggerated for illustrative purposes. The length of the SSBI would appear as illustrated in FIG. 3B if subsequent thermal anneals were used to drive the SSBI across the channel length.

Figure 3C:
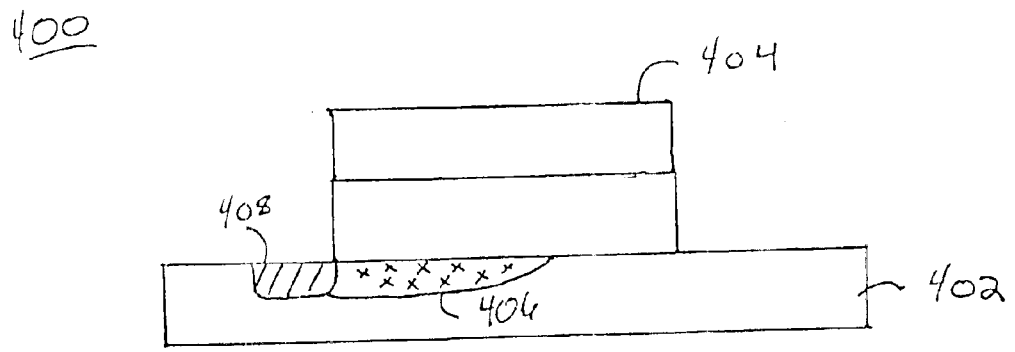
FIG. 3C is an illustration of an exemplary semiconductor device illustrating a source implant in accordance with an embodiment of the present invention.
Figure 3D:
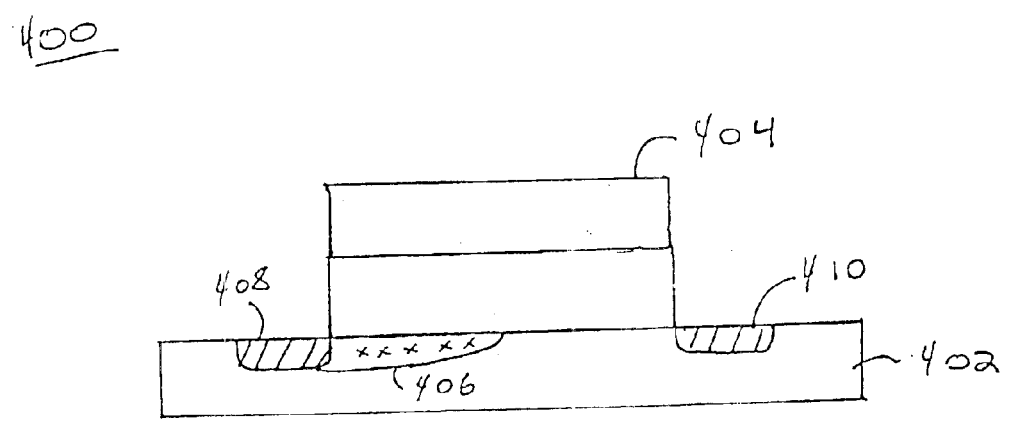
FIG. 3D is an illustration of an exemplary semiconductor device illustrating a drain side implant in accordance with an embodiment of the present invention.

Next as shown in FIG. 3C a source side implant 408 is provided to form the source. Typically, the source dopant is an n-type dopant. After the source implant is provided, a drain implant 410 of FIG. 3D is provided to form the drain. Typically, the drain implant is also an n-type dopant. Although source side implant 408 is shown as being performed after SSBI 406, source side implant 408 may be performed prior to SSBI 406.

Figure 3E:
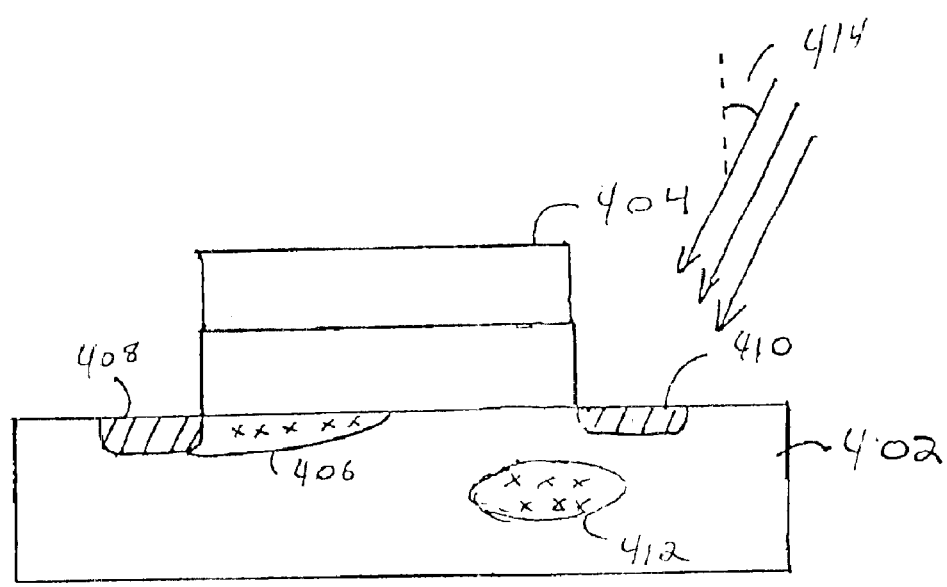
FIG. 3E is an illustration of an exemplary semiconductor device illustrating a drain side boron implant in accordance with an embodiment of the present invention.

With reference now to step 303 of FIG. 2, and FIG. 3E, a p-type implant is applied to the drain side of the floating gate device. In one embodiment, the p-type implant to the drain side is performed at a different angle that the p-type implant to the source side. Furthermore, in one embodiment, the p-type implant to the drain side is implanted to a greater depth than that of the p-type implant to the source side. In general, the drain side implant 412 is a drain side boron implant (DSBI) with a dosage of around $1 \times 10^{14}$ p/cm$^2$ (e.g., $1.5 \times 10^{14} \pm xyz$ particles, wherein xyz particles may be a small number of higher or lower particles of p/cm$^2$ which may occur during the implant process). When providing a DSBI an angled implant may be performed to implant underneath the gate stack. In one embodiment of the present invention, the angled DSBI 412 implant is provided at an angle 414 of FIG. 3E between approximately 30 and 60 degrees with respect to the surface of the semiconductor. In addition, the energy of the DSBI 412 implant may be 50 kev or higher, as compared to the 20 kev of the SSBI. Therefore, the DSBI 412 is implanted to a greater depth than that of the SSBI 406 and may have a different gradient than that of the SSBI. In one embodiment, a drain side boron implant to reduce DIBL can be implemented between many different processing steps of the manufacture of a transistor.

Figure 4:
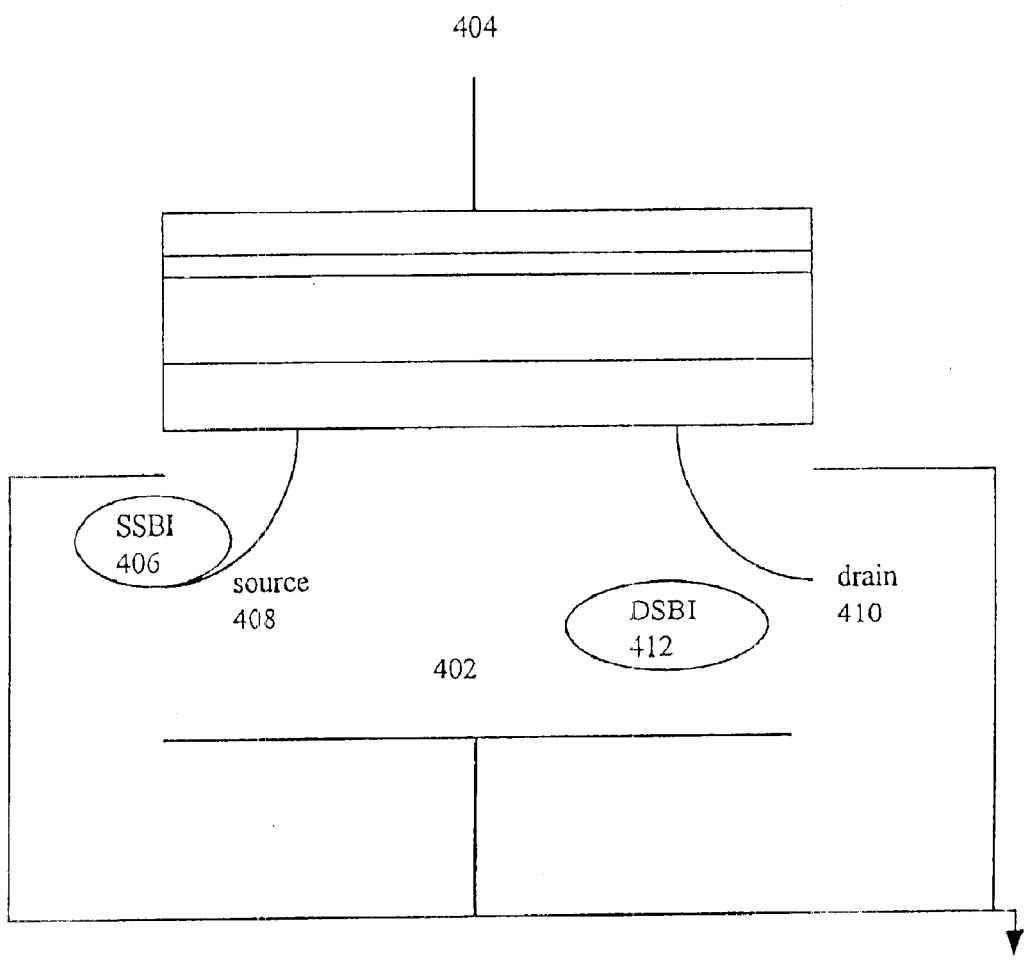
FIG. 4 is a block diagram of an exemplary floating gate device with improved short channel effect in accordance with an embodiment of the present invention.

FIG. 4 is a close up illustration of semiconductor 500 in accordance with an embodiment of the present invention. Semiconductor 500 comprises a gate stack 404 formed above a substrate 402. A source 408 has been formed on one side and a drain 410 has been formed on the opposite side. A SSBI 406 has been formed on the source side and a DSBI 412 has been formed on the drain side.

A beneficial consequence of implanting a DSBI is that due to the DSBI being implanted at an angle and a deeper depth, the drain junction will not have a lower breakdown. For example, since the drain junction has a higher doping profile in some areas and a lower doping profile in others, due to the implant offset, the drain junction will not have the lower voltage breakdown. In addition, a non-uniform concentration of the SSBI at the source reduces DIBL without increasing the gate threshold voltage.

Thus, the present invention provides, in various embodiments, a method and system for improving short channel effect on a floating gate device. Furthermore, the present invention provides a method and system for improving short channel effect on a floating gate device that works with reduced memory device sizes. Additionally, the present invention provides a method and system for improving short channel effect on a floating gate device which meets the above needs and which is compatible with existing memory manufacturing processes.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A method for improving short channel effect on a floating gate device comprising:

applying a p-type implant to a source side of the floating gate device; and applying a p-type implant to a drain side of the floating gate device, wherein the p-type implant to the drain side is performed at a different angle than the p-type implant to the source side, wherein the p-type implant to the drain side and the p-type implant to the source side are implanted using substantially the same dosage; and wherein the p-type implant to the drain side is implanted to a greater depth than that of the p-type implant to the source side.

2. The method as recited in claim 1 wherein the p-type implant for the source side is a source side boron implant (SSBI).

3. The method as recited in claim 2 wherein SSBI is implanted at 20 kev.

4. The method as recited in claim 2 wherein the SSBI is deposited at a dose of $1.5 \times 10^{14}$ particles per square centimeter.

5. The method as recited in claim 1 wherein the p-type implant for the drain side is a drain side boron implant (DSBI).

6. The method as recited in claim 5 wherein the DSBI is implanted at a minimum of 50 kev.

7. The method as recited in claim 5 wherein the DSBI is implanted at an angle between 30 degrees and 60 degrees.

8. The method as recited in claim 5 wherein the DSBI is deposited at a dose of $1.5 \times 10^{14}$ particles per square centimeter.

9. A method for improving short channel effect on a floating gate device comprising:

forming a floating gate device above a semiconductor substrate, wherein the floating gate device has a first side-wall and a second side-wall and wherein the first side-wall corresponds to a source side and the second side-wall corresponds to a drain side;

applying a p-type implant to the source side of the floating gate device, wherein the p-type implant is deposited at a dose of $1.5 \times 10^{14} \pm xyz$ particles per square centimeter; and applying a p-type implant to the drain side of the floating gate device, wherein the p-type implant is deposited at a dose of $1.5 \times 10^{14} \pm xyz$ particles per square centimeter, and wherein the p-type implant to the drain side is performed at a different angle than the p-type implant to the source side, and wherein the p-type implant to the drain side is implanted to a greater depth than that of the p-type implant to the source side.

10. The method as recited in claim 9 wherein the p-type implant for the source side is a source side boron implant (SSBI).

11. The method as recited in claim 10 wherein SSBI is implanted at 20 kev.

12. The method as recited in claim 9 wherein the p-type implant for the drain side is a drain side boron implant (DSBI).

13. The method as recited in claim 12, wherein the DSBI is implanted at a minimum of 50 kev.

14. The method as recited in claim 12 wherein the DSBI is implanted at an angle between 30 degrees and 60 degrees.

* * * * *